US007851899B2

(12) United States Patent
Chen et al.

(10) Patent No.: US 7,851,899 B2
(45) Date of Patent: Dec. 14, 2010

(54) MULTI-CHIP BALL GRID ARRAY PACKAGE AND METHOD OF MANUFACTURE

(75) Inventors: Fung Leng Chen, Singapore (SG); Seong Kwang Brandon Kim, Singapore (SG); Wee Lim Cha, Singapore (SG); Yi-Sheng Anthony Sun, Singapore (SG); Wolfgang Hetzel, Nattheim (DE); Jochen Thomas, Munich (DE)

(73) Assignees: UTAC - United Test and Assembly Test Center Ltd., Singapore (SG); Infineon Technologies, Munich (DE)

( * ) Notice: Subject to any disclaimer, the term of this patent is extended or adjusted under 35 U.S.C. 154(b) by 498 days.

(21) Appl. No.: 10/552,046

(22) PCT Filed: Apr. 2, 2004

(86) PCT No.: PCT/IB2004/001734

§ 371 (c)(1),
(2), (4) Date: Jan. 9, 2007

(87) PCT Pub. No.: WO2004/088727

PCT Pub. Date: Oct. 14, 2004

(65) Prior Publication Data

US 2007/0158815 A1    Jul. 12, 2007

Related U.S. Application Data

(60) Provisional application No. 60/459,353, filed on Apr. 2, 2003.

(51) Int. Cl.
*H01L 23/02* (2006.01)
*H01L 23/12* (2006.01)
*H01L 23/00* (2006.01)

(52) U.S. Cl. .................. 257/686; 257/700; 257/701; 438/107; 438/118; 438/125; 438/126; 438/127

(58) Field of Classification Search ................ 438/597, 438/612, 108, 109; 257/685, 686, 737, 738, 257/787, 790, 796
See application file for complete search history.

(56) References Cited

U.S. PATENT DOCUMENTS

| 6,424,033 | B1 * | 7/2002 | Akram .................. 257/718 |
| 6,737,750 | B1 * | 5/2004 | Hoffman et al. ........... 257/777 |
| 6,987,058 | B2 * | 1/2006 | Hall ..................... 438/617 |

(Continued)

*Primary Examiner*—Ha Tran T Nguyen
*Assistant Examiner*—Karen M Kusumakar
(74) *Attorney, Agent, or Firm*—Sughrue Mion, PLLC

(57) ABSTRACT

A BGA package is disclosed including a base IC structure having a base substrate, with an opening running length-wise there through. A first semiconductor chip is mounted face-down on the base substrate so the bond pads thereof are accessible through the opening. The package also includes a secondary IC structure including a secondary substrate, having an opening running there through, and a second semiconductor chip. The second chip is mounted face-down on the secondary substrate so that the bond pads thereof are accessible through the opening in the secondary substrate. An encapsulant fills the opening in the secondary substrate and forms a substantially planar surface over the underside of the secondary substrate. The substantially planar surface is mounted to the first chip of the base IC structure through an adhesive. Wires connect a conductive portion of the secondary IC structure to a conductive portion of the base IC structure.

14 Claims, 10 Drawing Sheets

U.S. PATENT DOCUMENTS

| | | |
|---|---|---|
| 7,005,316 B2 * | 2/2006 | Lee et al. .................... 438/106 |
| 7,199,453 B2 * | 4/2007 | Lai et al. .................... 257/666 |
| 2001/0012526 A1 | 8/2001 | Tandy |
| 2002/0046854 A1 * | 4/2002 | Huang et al. ............... 174/52.1 |
| 2002/0127771 A1 | 9/2002 | Akram et al. |
| 2002/0189852 A1 | 12/2002 | Hirai et al. |
| 2004/0061243 A1 * | 4/2004 | Bai ........................... 257/787 |
| 2004/0119152 A1 * | 6/2004 | Karnezos et al. ........... 257/686 |
| 2005/0012195 A1 * | 1/2005 | Go et al. .................... 257/686 |
| 2005/0040508 A1 * | 2/2005 | Lee ........................... 257/686 |
| 2007/0210433 A1 * | 9/2007 | Subraya et al. ............. 257/686 |

* cited by examiner

MULTI-CHIP BALL GRID ARRAY PACKAGE AND METHOD OF MANUFACTURE

This application claims the benefit of the co-pending U.S. Provisional Application No. 60/459,353, filed on Apr. 2, 2003, and incorporated herein by reference.

BACKGROUND OF THE INVENTION

1. Field of the Invention

The present invention generally relates to the field of semiconductor integrated circuit (IC) packaging. In particular the present invention relates to an improved multi-chip ball grid array (BGA) package, which can be utilized with IC chips of identical or similar sizes, and a method of manufacturing the same.

2. Discussion of the Related Art

Semiconductors are materials that have characteristics of insulators and conductors. In today's technology, semiconductor materials have become extremely important as the basis for transistors, diodes, and other solid-state devices. Semiconductors are usually made from germanium or silicon, but selenium and copper oxide, as well as other materials are also used. When properly made, semiconductors will conduct electricity in one direction better than they will in the other direction.

Currently, emerging electronic product applications create a set of challenges for the IC packaging industry. Once the IC chips have been produced and encapsulated in semiconductor packages, they may be used in a wide variety of electronic appliances. The variety of the electronic devices which incorporate semiconductor packages has grown dramatically in recent years and includes cellular phones, portable computers, hand-held devices, and many others. Each of these devices typically includes a motherboard on which a number of semiconductor packages are secured to provide multiple electronic functions. As consumer demand increases, the size of these devices decreases and the cost is reduced. Therefore, it is increasingly desirable to reduce the profile of the integrated semiconductor packages so that the resultant electronic systems can be incorporated into more compact devices and products.

Recently, multi-chip packaging, which is a special field of IC packaging that relates to the assembly of multiple semiconductor chips within a single IC package entity, has become increasingly popular. This popularity is driven by an industry demand to package more functional silicon content into a smaller package at a lower cost Packaging two or more silicon chips within a single package reduces the related cost and also reduces the area required on the printed circuit boards, on which the IC package is mounted. In addition, multi chip packaging enables close proximity of chips resulting in shorter electronic signal paths between chips in the package. This reduces electronic signal travel time and improves overall speed and performance. Further, multi-chip packages save considerable mounting area, thus increasing valuable layout flexibility.

Multi-chip packages, in combination with BGA technology, are viewed as part of the solution for the widening gap between silicon I/O density and performance and the material capabilities of the package and board/substrate structure. Multi-chip packages can be viewed as standard single-chip packages modified to accommodate both multiple chips and passive components in order to provide the user with higher functionality integration. Typically, most multi-chip packages incorporate between two and six chips and are packaged in a conventional BGA.

The advantages of multi-chip packaging are numerous. For example, it allows for greater functionality in a time-to-market window that cannot be met through silicon integration. Effective use of multi-chip packages yields increased density and performance and reduced size and weight at the board or system level, while also reducing board area and routing complexity. Often, board layer reduction offsets the additional costs of using multi-chip packages. Additional benefits of multi chip packaging include design optimization through use of the most cost-effective silicon solutions and the ability to assemble packages utilizing different semiconductor technologies, die geometries, or types of chips in the same package.

This special field of IC packaging increases the value of high-speed designs, assembly processes and materials incorporated into a multi-chip package. Packaging chips together in this manner also facilitates the process of assembling stacked die or multi level, two-sided packages. The incorporation of different interconnection technologies, such as flip-chip or wire bond, into the multi-chip package is easily accommodated using this technology.

Typically, in multi-chip packaging, the component chips can be stacked vertically or can be arranged side by side within the package body. FIGS. 1A and 1B show examples of multi-chip packages utilizing stacked and side by side arrangements, respectively. Interconnections between chips and the external terminals of the package can be achieved through conventional wire bonding, as shown in FIGS. 1A and 1B, bumps in flip chip fashion, lead bonding, or through combinations of the above mentioned techniques. Chips stacked vertically require less package body area and therefore less space on the printed circuit board compared to those arranged side-by-side. Stacked chips therefore are generally the preferred method used in multi-chip packaging. However, there are several fundamental difficulties in chip stacking relating to stacking chips of similar sizes and to certain bond pad layout designs.

As shown in FIG. 1A, conventional chip-stacking technology comprises mounting a first IC chip 115A on a substrate 101 and then mounting a second chip 116A on top of the first chip 115A The first chip 115A is coupled to the substrate though a number of thin wires 121A linking bond pads (not shown) on the top surface of the first chip 115A to conductive material 103 on the top surface of the substrate 101. This method requires that a certain portion of the top surface of the first chip 115A, including bond pads, be free to connect to the thin wires 121A. Therefore, the second chip 116A must have a smaller footprint than the first chip 115A. If the second chip 116A were as large or larger than the first chip 115A, there would be no space on the top surface of the first chip 115A for the bond pads to be connected to the thin wires 121A.

As shown in FIG. 1B, multi-chip packaging utilizes chips arranged side by side within the package body. This packaging technology comprises mounting a first IC chip 115B on a substrate 101 and then mounting a second chip 116B beside the first chip 115A on the substrate 101. Both the first chip 115B and the second chip 116B are coupled to the substrate though a number of thin wires 121B linking bond pads (not shown) on the top surfaces of the first chip 115B and second chip 116B to conductive material 103 on the top surface of the substrate 101.

Thus, one current limitation of chip stacking technology is that chips of similar sizes with periphery bond pad layout designs, cannot be stacked directly on each other because the bonding pads of the bottom chip would be blocked by the upper chip.

For chips with non-periphery bond pad layout design, i.e. those with bond pads substantially centrally located on the surface of the chip, the probability that the bond pads of the bottom chip will be blocked is high even when smaller chips are stacked on top.

The present invention provides a feasible solution to these problems related to chip-stacking. The invention increases the functional capacity of semiconductor IC chips, while significantly reducing the need for package body area and printed circuit board space. The invention also enables an increase in yield.

Yield is the ratio of the useable components of an end package to those initially submitted for processing. Yield can be assessed at any input-output stage in processing, and must be carefully defined and understood. Often, the yield of a wafer is not very high. Therefore, it is important to determine which chips are defective and which chips are functional before the chips are packaged. Through a testing process, defective chips are discarded or repaired so that only functional chips are packaged in the final electronic devices.

It is increasingly important to know whether a chip is functional before it is packaged, because more and more chips are packed into individual multi-chip modules. Without testing, the compounded effect of the individual yields of multiple chips can result in very low yields for multi-chip modules. Therefore, there is a need for an improved method allowing for the testing of component chips before fill assembly.

The present invention also provides for facilitated product testing. It enables manufacturers to test the functional status of a chip prior to mounting it on a base substrate structure. This reduces the risk of combining a bad chip with a good one in multi-chip packaging (generally a non-reversible process) and thereby improves the final yield of the package.

SUMMARY OF THE INVENTION

A BGA package according to a first exemplary embodiment of the present invention comprises a base IC structure and a plurality of wires. The base IC structure comprises a base substrate with an opening running lengthwise therethrough. The base substrate comprises a first face and a second face, opposite to the first face. The base substrate may also comprise a plurality of vias running between the first face and the second face, wherein the conductive portion also extends through the vias. The base substrate further comprises a conductive portion disposed on the first and second faces. The base substrate further comprises a layer of solder mask disposed on the remaining free portions of the conductive portion on the first and second faces, leaving designated areas of the conductive portion free from solder mask. The base IC structure also comprises a first semiconductor chip. The first semiconductor chip comprises a first face, a second face, opposite to the first face, and a plurality of sides. The first semiconductor chip also comprises a plurality of bond pads aligned lengthwise substantially along the central axis of the second face of the first semiconductor chip. The second face of the semiconductor chip is mounted to the base substrate so that the bond pads are accessible through the opening in the base substrate. The BGA package further comprises a first plurality of wires. Each wire links one of the bond pads of the first semiconductor chip through the opening to a designated area of the conductive portion disposed on the second face of the base substrate.

According to one aspect of the first exemplary embodiment of the present invention, the BGA package further comprises a secondary IC structure. The secondary IC structure comprises a secondary substrate with an opening running lengthwise therethrough. The secondary substrate comprises a first face and a second face, opposite to the first face. The secondary IC structure also comprises a second semiconductor chip comprising a first face, a second face, and a plurality of bond pads aligned lengthwise substantially along the central axis of the second face of the chip. The second face of the second semiconductor chip is mounted to the secondary substrate, such that the plurality of bond pads are accessible through the opening in the secondary substrate. The secondary IC structure also comprises a second plurality of wires, each linking one of the bond pads of the second semiconductor chip through the opening to the conductive portion disposed on the second face of the secondary substrate. The secondary IC structure further comprises an encapsulant filling the opening around the second plurality of wires and covering the conductive portion disposed on the second face of the secondary substrate. The secondary IC structure is mounted on the base IC structure. According to this aspect of the first exemplary embodiment, the BGA package further comprises a third plurality of wires, each linking the conductive portion of the secondary IC structure to a designated area of the conductive portion disposed on the first face of the base substrate.

According to another aspect of the first exemplary embodiment of the present invention, the BGA package can further comprise at least one additional secondary IC structure mounted on the first face of the second semiconductor chip. Alternately, the package can further comprise a thermal dissipation element having a first face and a second face, wherein the second face of the thermal dissipation element is mounted on the first face of the second semiconductor chip.

A method of assembling a ball grid array package according to a second exemplary embodiment of the present invention comprises providing a base IC structure and a secondary IC structure. The base IC structure comprises a base substrate and a first semiconductor chip mounted on the base substrate in a die-down configuration. The secondary IC structure comprises a secondary substrate and a second semiconductor chip mounted on the secondary substrate in a die-down configuration.

The method also comprises encapsulating the secondary IC structure, such that the encapsulant forms a substantially planar surface on the underside of the secondary IC structure. The method also comprises mounting the substantially planar surface of the encapsulant on the base IC structure through an adhesive layer and electrically connecting the secondary IC structure to the base IC structure through a plurality of wires. Each of the plurality of wires links a conductive portion of the secondary IC structure to a conductive portion of the base IC structure. Also, the method comprises encapsulating the plurality of wires and determining whether there are additional secondary IC structures to add. The method further comprises encapsulating the entire BGA structure.

BRIEF DESCRIPTION OF THE DRAWINGS

These and other features, aspects, and advantages of the present invention will become better understood with reference to the following description, claims, and accompanying drawings, which should not be read to limit the invention in any way, in which:

DETAILED DESCRIPTION OF THE INVENTION

The present invention will be explained in further detail by making reference to the accompanying drawings, which do not limit the scope of the invention in any way.

Figure 1A:
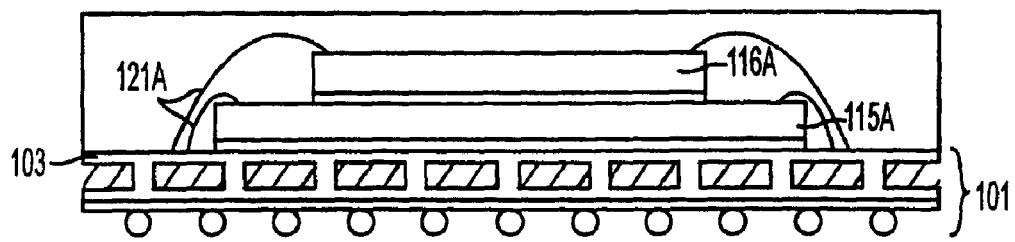
FIG. 1A is a cross-section of a conventional multi-chip package having stacked semiconductor chips.
Figure 1B:
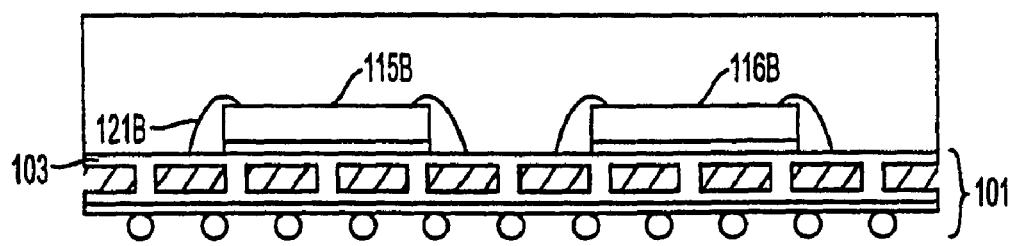
FIG. 1B is a cross-section of a conventional multi-chip package having multiple semiconductor chips mounted side-by-side.
Figure 2:
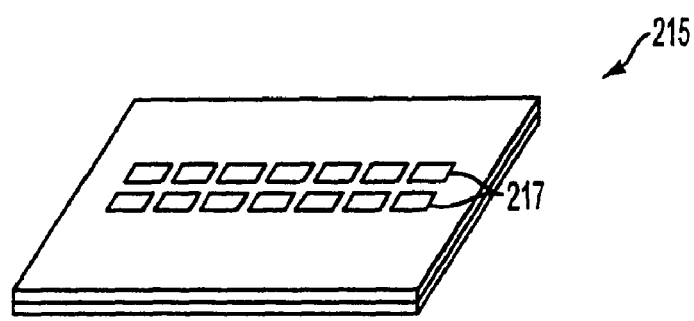
FIG. 2 is a perspective view of a semiconductor chip.

FIG. 2 illustrates a perspective view of the semiconductor chip 215 with the bond pads 217 accessible through the opening in the base substrate. FIGS. 3A-3C and 4A-4C illustrate steps in the manufacture of the package according to the first exemplary embodiment. FIG. 5 illustrates a ball grid array package according to a first exemplary embodiment of the present invention as subsequently described.

Figure 3A:
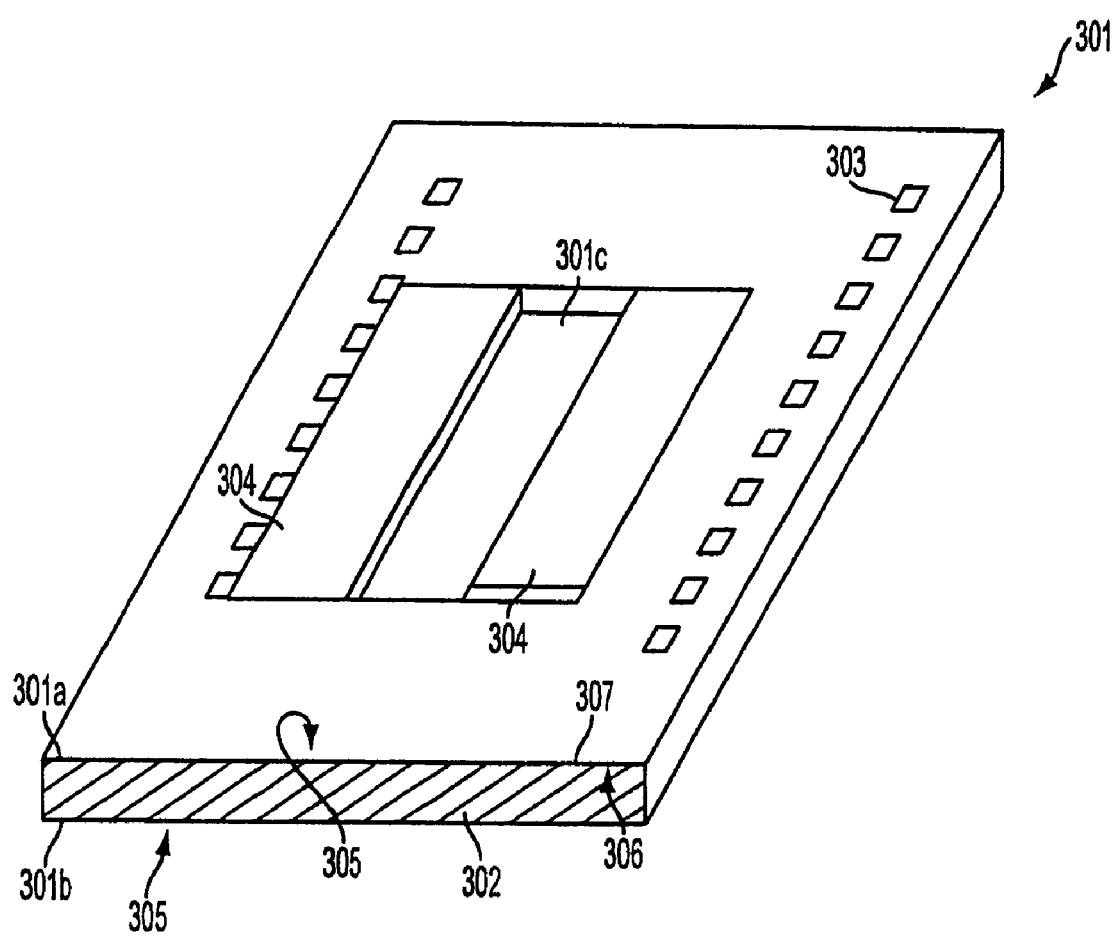
FIG. 3A is a perspective view of a base substrate according to an exemplary embodiment of the present invention that shows only a structure that has been cut by a section line.
Figure 3B:
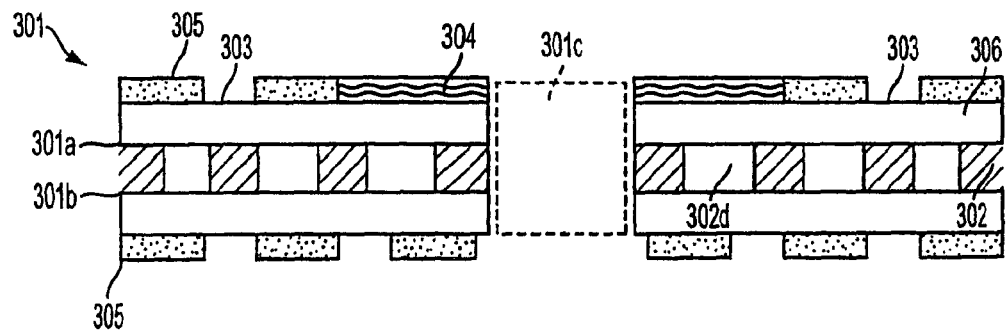
FIG. 3B is a cross-section of the substrate of FIG. 3A.
Figure 3C:
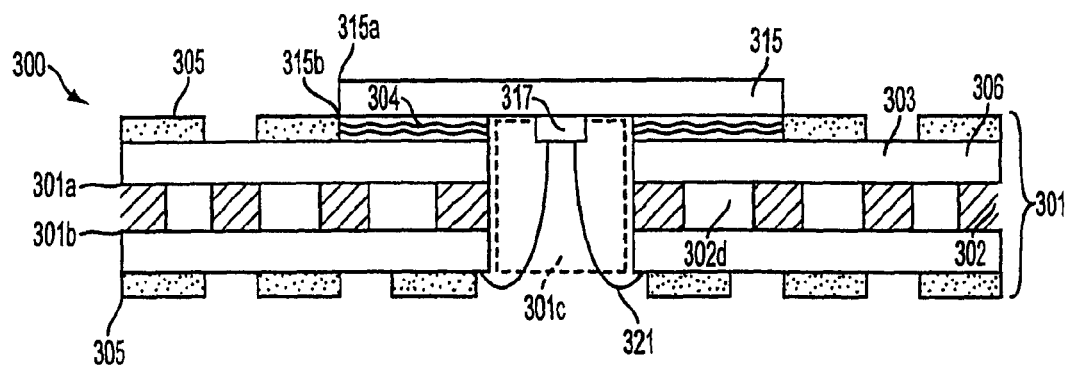
FIG. 3C is a cross-section of a base IC structure according to an exemplary embodiment of the present invention.

FIGS. 3A-3C illustrate a base IC structure 300 according to the first exemplary embodiment. As illustrated in FIG. 3C, the base IC structure 300 comprises an IC chip 315 mounted in a die-down configuration on a base substrate 301. According to this die-down configuration, and as will be explained in further detail herein, an IC chip 315 is mounted face-down on a substrate having an opening 301c therein. Thereby, bond pads 317 on the face of the IC chip 315 are accessible through the opening 301c in the substrate so that they may be connected to base conductors 307 in a conductive layer 306 on the substrate through the use of shorter connection wires than would be required for a traditional face-up mounting of an IC chip.

FIGS. 3A and 3B illustrate a perspective view and a cross-section, respectively, of a base substrate 301 having a first face 301a and a second face 301b, opposite to the first face. FIG. 3A is an illustration that only shows the structure that has been cut by a section line. Hereinafter, the terms "first" and "second" are merely used for convenience and do not reflect the order of formation, placement, or observation. There is an opening 301c in the base substrate 301 (this may be thought of as a first opening). Preferably, but without limitation, the opening 301c runs lengthwise along the central axis of the base substrate 301. The opening allows subsequently applied interconnecting wires to pass through the substrate 301. The substrate 301 comprises a substrate material 302, which can be Epoxy Glass Laminates, BT, FR4, Tape, or FR5. A conductive layer 306 that consists of base conductors 307 and conductive traces 303 is formed on the first and second faces 301a and 301b of the substrate 301 and it is made of a conducting material which is generally used for routing electronic signals.

Vias 302d are formed at various locations in the substrate and provide passages between the first face and the second face. Vias 302d are present to make the electrical connection between the base conductors 307. The vias 302d are used to transport a component signal from one conducting layer to another. The vias in the substrate material 302 thereby allow conductive traces 303 to pass through from one side of the substrate to the other. Ordinarily, a plurality of vias 302d are used but only a single via 302d is illustrated for convenience.

The vias allow conductive traces 303 to pass through from one side of the substrate to the other. There is no restriction on the location of such vias in the base structure. The conductive material of the conductive layer 306 can be copper, nickel, or a gold layer for example. An adhesive layer 304, for chip attachment, is disposed on the first face 301a of the substrate 301. The adhesive 304 is disposed along the opening 301c in the substrate 301 and does not reach to the edges of the substrate 301. Thereby, a portion of the conductive layer 306 along the edges of the first face 301a of the substrate material is left free from adhesive 304. The adhesive 304 can comprise for example, electrically conductive or non-conductive epoxy, paste, or adhesive film, or the like, as would be understood by those skilled in the art, and are intended to be encompassed here.

A solder mask 305 is disposed on the first and second faces 301a and 301b of the base substrate 301. Designated areas of the solder mask 305 are removed to reveal areas of the conductive traces 303 on both the first and second faces 301a and 301b of the base substrate 301. The conductive traces 303 of the conductive layer 306 are thereby available for connection to subsequent interconnects.

FIG. 3C is a cross-section of the base substrate of FIGS. 3A and 3B with a first semiconductor chip 315 mounted thereon, forming the base IC structure 300. The first semiconductor chip 315 having a first face 315a and a second face 315b, opposite to the first face is mounted on the base substrate of FIGS. 3A and 3B. The first chip 315 is similar to semiconductor chip 215, the second face of which is illustrated in a peripheral view in FIG. 2. The chip 315 has a plurality of bond pads 317 aligned thereon in rows, substantially along the central axis of the second face 315b of the chip 315. The second face 315b of the chip 315 is mounted on the adhesive layer 304 of the base substrate 301. The plurality of bond pads 317 of the chip 315 are accessible through the opening 301c in the base substrate 301. A first plurality of wires 321 electrically conductively link the bond pads 317 of the chip 315 to the conductive layer 306 on the second face of the base substrate. The first plurality of wires 321 and later-described interconnect wires can be comprised of gold, gold with some level of impurities, aluminum, or copper, for example. For use in the wires, the gold may contain one percent impurities, which could include dopants or additives included to improve the properties of the wires, as would be understood by one of skill in the art.

Figure 4A:
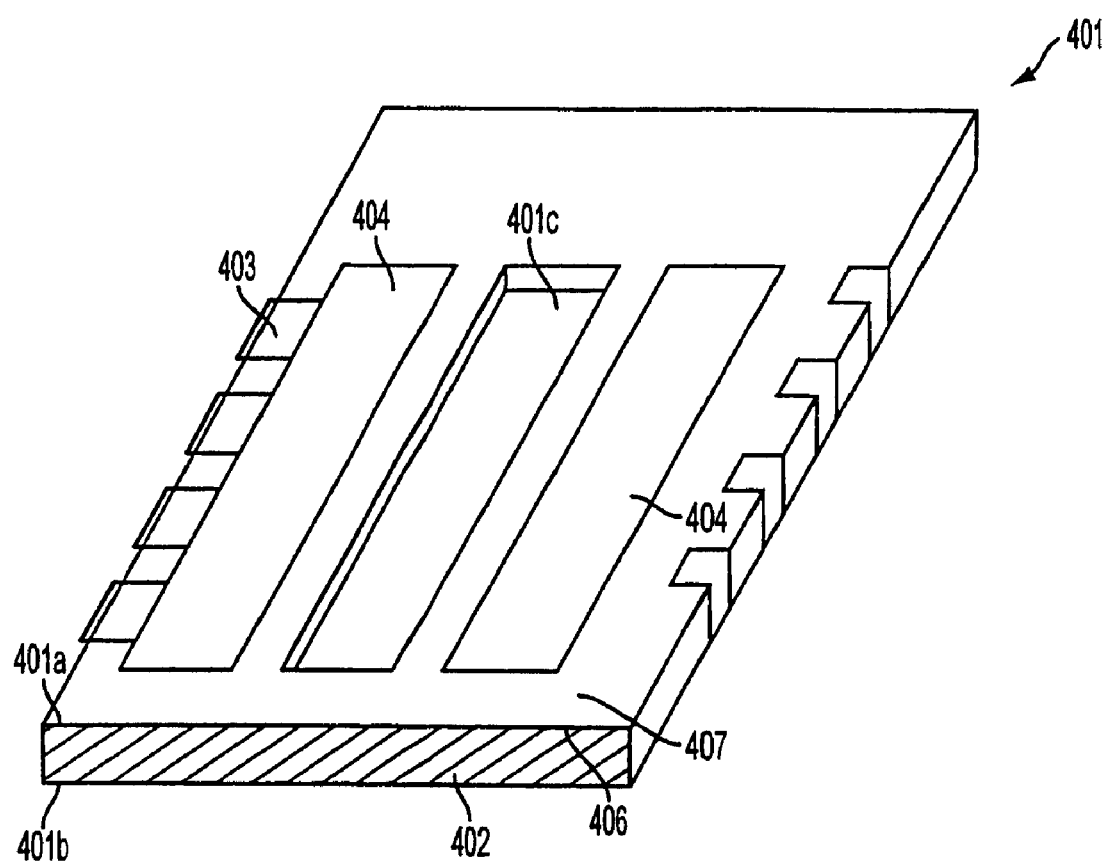
FIG. 4A is a perspective view of a secondary substrate according to an exemplary embodiment of the present invention that shows only a structure that has been cut by a section line.
Figure 4B:
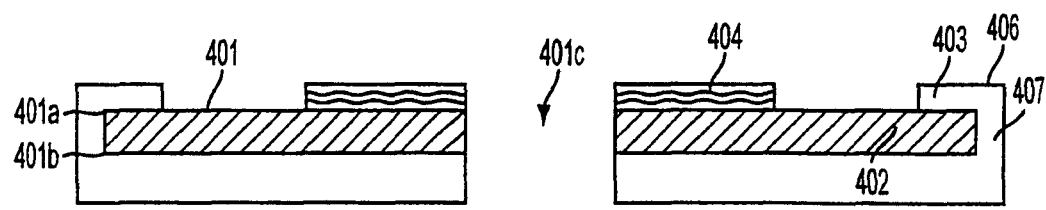
FIG. 4B is a cross-section of the substrate of FIG. 4A.
Figure 4C:
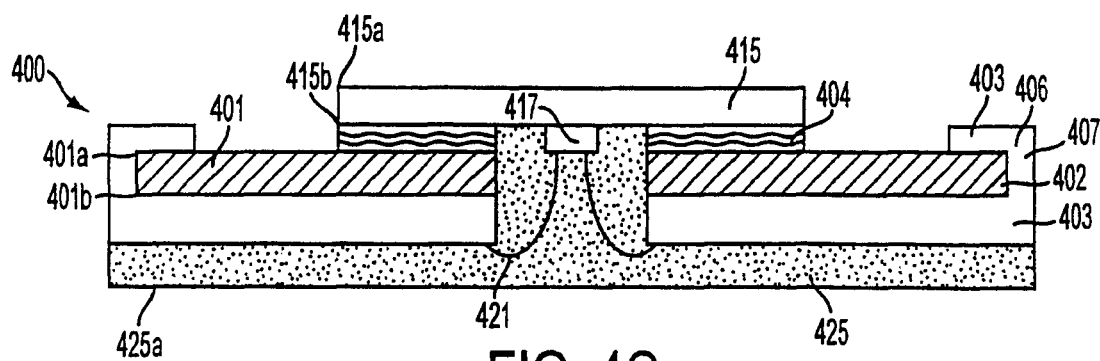
FIG. 4C is a cross-section of a secondary IC structure according to an exemplary embodiment of the present invention.
Figure 5:
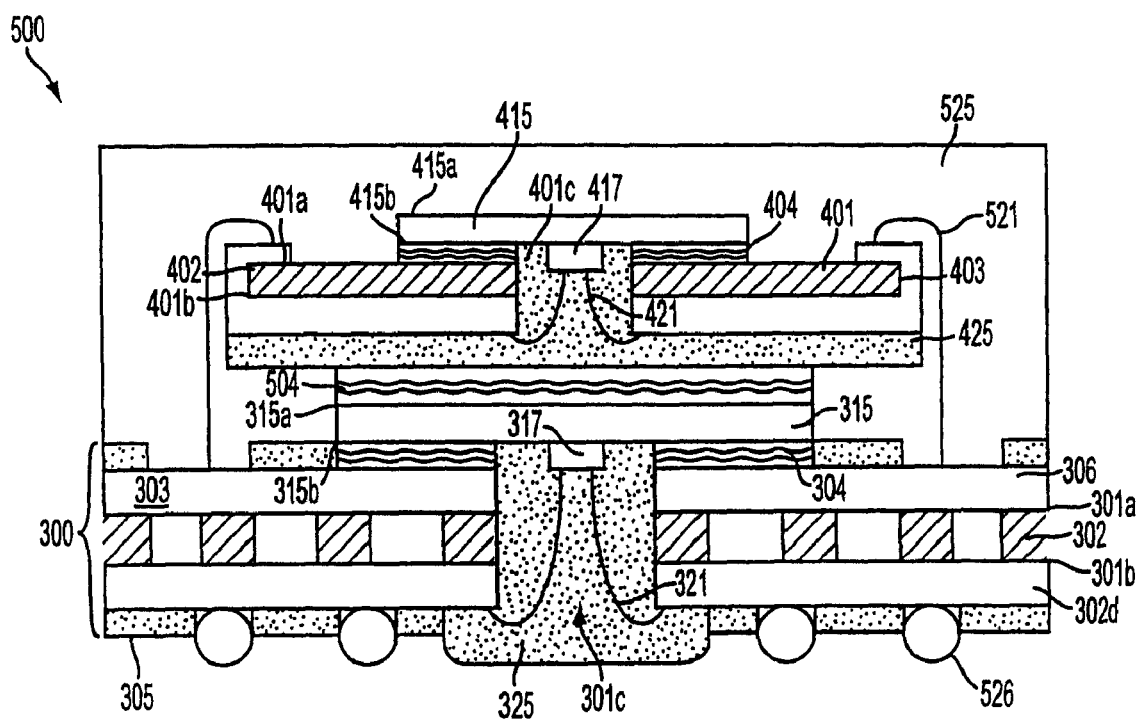
FIG. 5 is a BGA package according to an exemplary embodiment of the present invention.

FIG. 4A-4C illustrate a secondary IC structure according to the first exemplary embodiment of the present invention. FIGS. 4A and 4B illustrate a perspective view and a cross-section, respectively, of a secondary substrate 401 having a first face 401a and a second face 401b, opposite to the first face. There is an opening 401c in the secondary substrate 401 running lengthwise there through (this may be thought of as a second opening). As described with respect to the opening in the base substrate, the opening 401c in the secondary substrate 401 allows subsequent interconnecting fine wires 421 to pass through the substrate 401. The secondary substrate 401 comprises a substrate material 402, which can comprise the same materials as described above with respect to the base substrate material 302. A conductive layer 406 has a plurality of conductive traces 403 on the substrate material 402. Each of the conductive traces 403 is disposed on the second face 401b of the secondary substrate 401 and each wraps around the sides of the substrate 401 and onto the first face 401a thereof. As described with respect to the base substrate 301, an adhesive layer 404 is applied to the first face 401a of the secondary substrate. The adhesive layer 404, which can comprise any of the materials described above with respect to the adhesive layer 304 of the base substrate 301, is disposed around the opening 401c on the first face 401a of the secondary substrate 401.

FIG. 4C is a cross-section of the secondary substrate 401 of FIGS. 4A and 4B with a second semiconductor chip 415 mounted thereon, thereby forming the secondary IC structure 400. A second semiconductor chip 415 having a first face 415a and a second face 415b, opposite to the first face, is mounted on the secondary substrate 401 of FIGS. 4A and 4B. The second semiconductor chip 415 is structurally similar to the first semiconductor chip 315. The chip 415 has a plurality of bond pads 417 thereon aligned in rows substantially along the central axis of the second face 415b of the chip 415. The second face 415b of the chip 415 is mounted on the adhesive layer 404 of the secondary substrate 401. The plurality of bond pads 417 of the chip 415 are accessible through the opening 401c in the secondary substrate 401. A second plurality of wires 421 electrically conductively link each of the bond pads 417 to a conductive trace 403 on the second face 401b of the substrate 401. In order to provide a surface of the secondary IC structure 400 to be mounted to the base IC structure 300, an encapsulant 425 is applied to the secondary IC structure 400. The encapsulant 425 and later described encapsulants can be a polymer-based molding compound or any other of the many known encapsulant materials, as would be understood by one of skill in the art. The encapsulant 425 fills in the opening 401c, surrounding the plurality of wires 421. The encapsulant 425 also covers the second face 401b of the secondary substrate, thereby forming a substantially planar surface 425a which can be mounted to the base substrate structure 300 of FIG. 3C, as will be described.

FIG. 5 illustrates a cross-section of a BGA package 500 according to the first exemplary embodiment of the present invention, incorporating the base IC structure 300 and the secondary IC structure 400 described with respect to FIGS. 3A-3C and 4A-4C. As illustrated, the substantially planar surface formed from encapsulant 425 of the secondary IC structure 400, is mounted to the base IC structure 300 through an adhesive layer 504. The adhesive layer 504 is disposed on the first face 315a of the first semiconductor chip 315. A plurality of wires 521 provide a conductive link between the conductive layer 406 of the secondary IC structure 400 and the conductive traces 303 of the base IC structure 300. Wires 521 provide an electrical connection from the base structure to the second structure. A second encapsulant 325 is provided to protect the first plurality of wires 321 of the base IC structure. The second encapsulant 325 fills the opening 301c in the base substrate, and covers a portion of the second face 301b of the base substrate surrounding the opening 301c, thus protecting the first plurality of wires 321. A third encapsulant 525 is provided to encapsulate the entire BGA package. The third encapsulant 525 encloses the first face 301a of the base substrate, the first semiconductor chip 315 and it's interconnects, and the second semiconductor chip 415 and it's interconnects. The third encapsulant 525 protects all the elements of the BGA package 500, and also provides added strength and stability for the package.

As illustrated by FIG. 5, the stacked semiconductor chips in the package of the present invention can be of the same size. The present invention even enables the stacking of a second larger chip on a first smaller chip, as would be understood by one of skill in the art. The mounting of the semiconductor chips 315 and 415 in a die-down configuration enables this stacking. The die-down configuration provides a shorter communication path between the bond pads 317 of the chip 315 and the conductive portion 303 on the second face of the base substrate. This die-down configuration provides direct thermal dissipation along with bonding that yields short bond wires for high-speed electrical performance.

Figure 6:
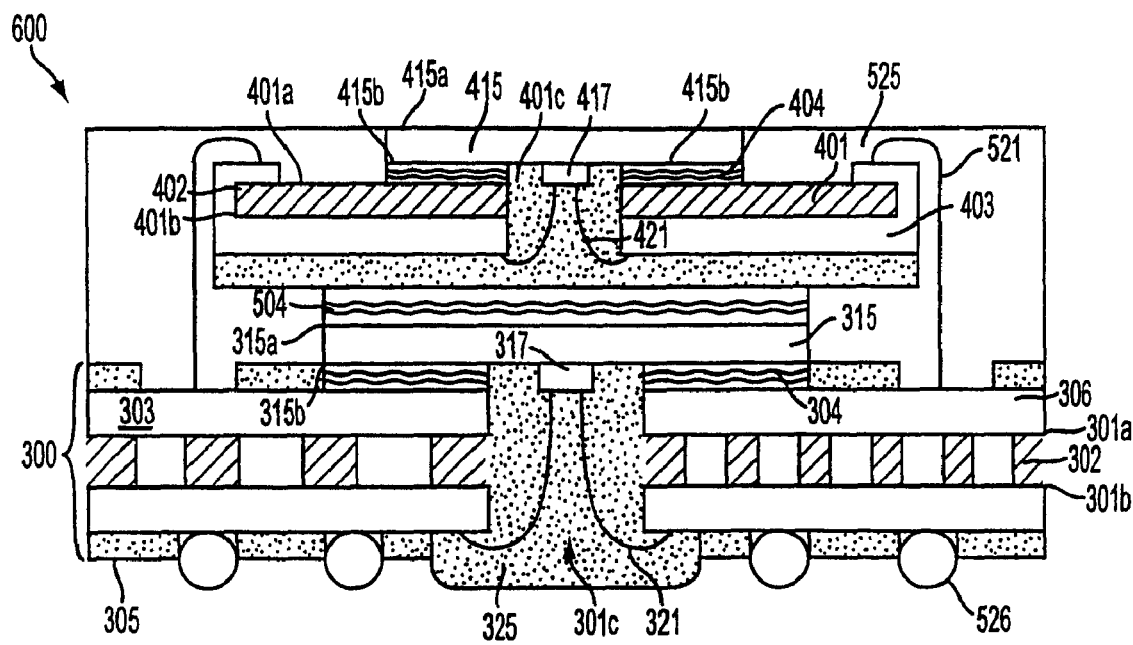
FIG. 6 illustrates a cross-section of another BGA package according to an exemplary embodiment of the present invention.

In FIG. 6, the same numbers represent the same elements as previously described. As illustrated by FIG. 6, the first face 415a of the second semiconductor chip 415 may be left free from encapsulant 525. This aspect of the BGA package of the first exemplary embodiment allows for the second IC chip 415 to be further connected to an additional additional secondary IC structure 700A, as shown in FIG. 7, or to a heat spreader 830 as shown in FIG. 8.

Figure 7:
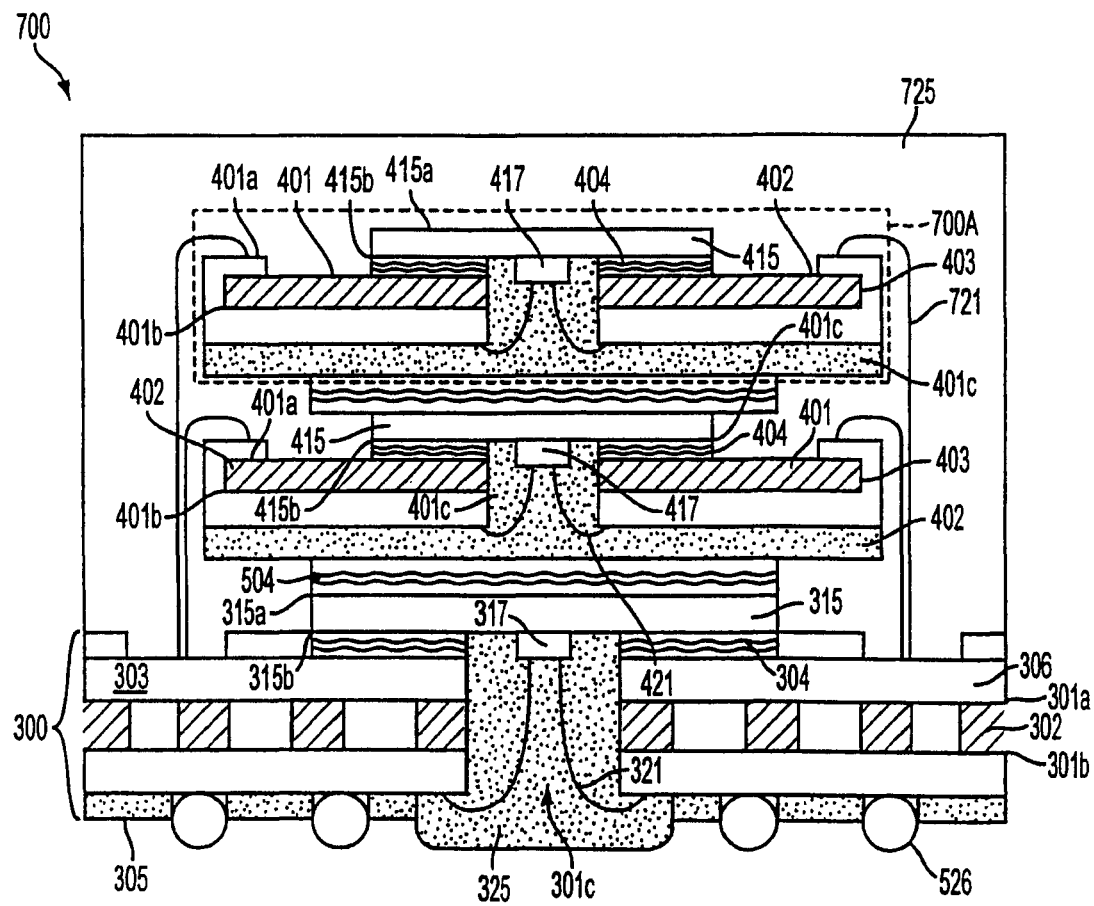
FIG. 7 illustrates a cross-section of a BGA package with three semiconductor chips according to an exemplary embodiment of the present invention.

FIG. 7 illustrates a cross-section of a BGA package 700 according to an aspect of the first exemplary embodiment, including an additional secondary IC structure 700A. As shown, the structure of the present invention enables the stacking of more than two semiconductor chips. The additional secondary IC structure 700A is the same as the secondary IC structure 400, described above with reference to FIG. 4, and will not be described again here. Wires 721 provide an electrical connection form the secondary IC structure 400 to the additional secondary IC structure 700A. As was described with respect to the BGA package 500 of FIG. 5, the entire package 700 can be encapsulated by encapsulant 725 for protection, strength, and stability.

Figure 8:
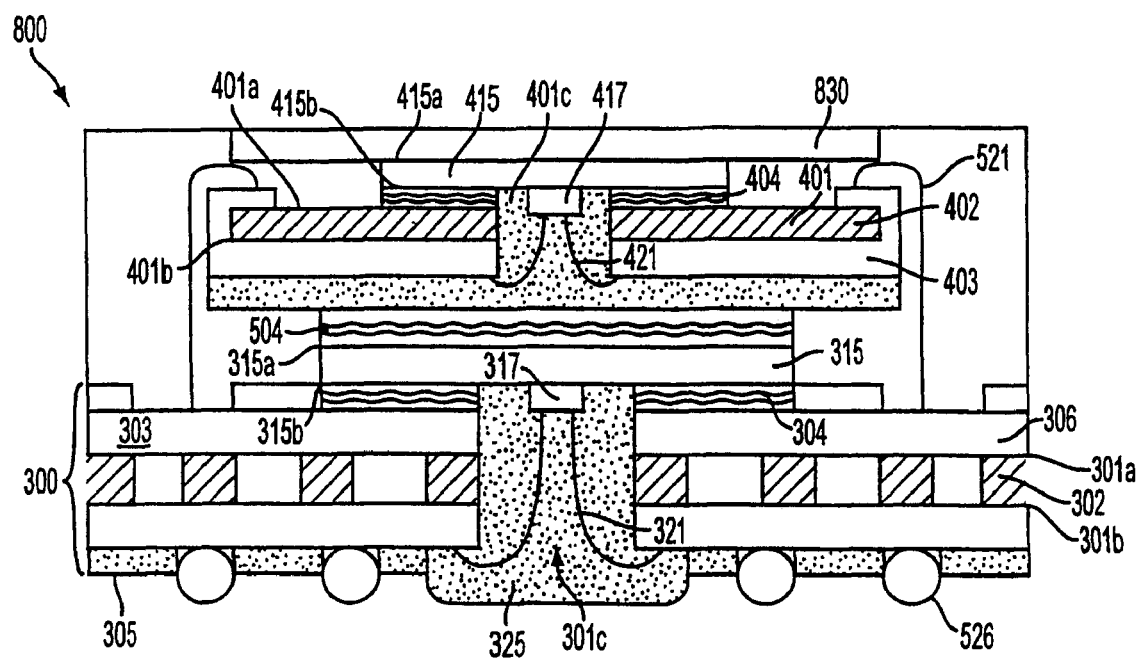
FIG. 8 illustrates a cross-section of a BGA package having a heat spreader according to an exemplary embodiment of the present invention.

FIG. 8 illustrates a cross-section of a BGA package 800 according to another aspect of the first exemplary embodiment, including a heat spreader 830. The large portion of the electricity consumed by IC devices is discarded as heat A heat spreader, such as the one illustrated in FIG. 8, or a system-level heat sink, which can also be mounted to a BGA package of the first exemplary embodiment, aids in the dissipation of heat, so that internal components of the packages are not damaged by excess heat.

Hereinafter, the elements discussed with respect to the following embodiment and aspects are similar to those discussed with respect to the aforementioned embodiments and aspects and may comprise the same exemplary materials and constructions as discussed above.

Figure 9:
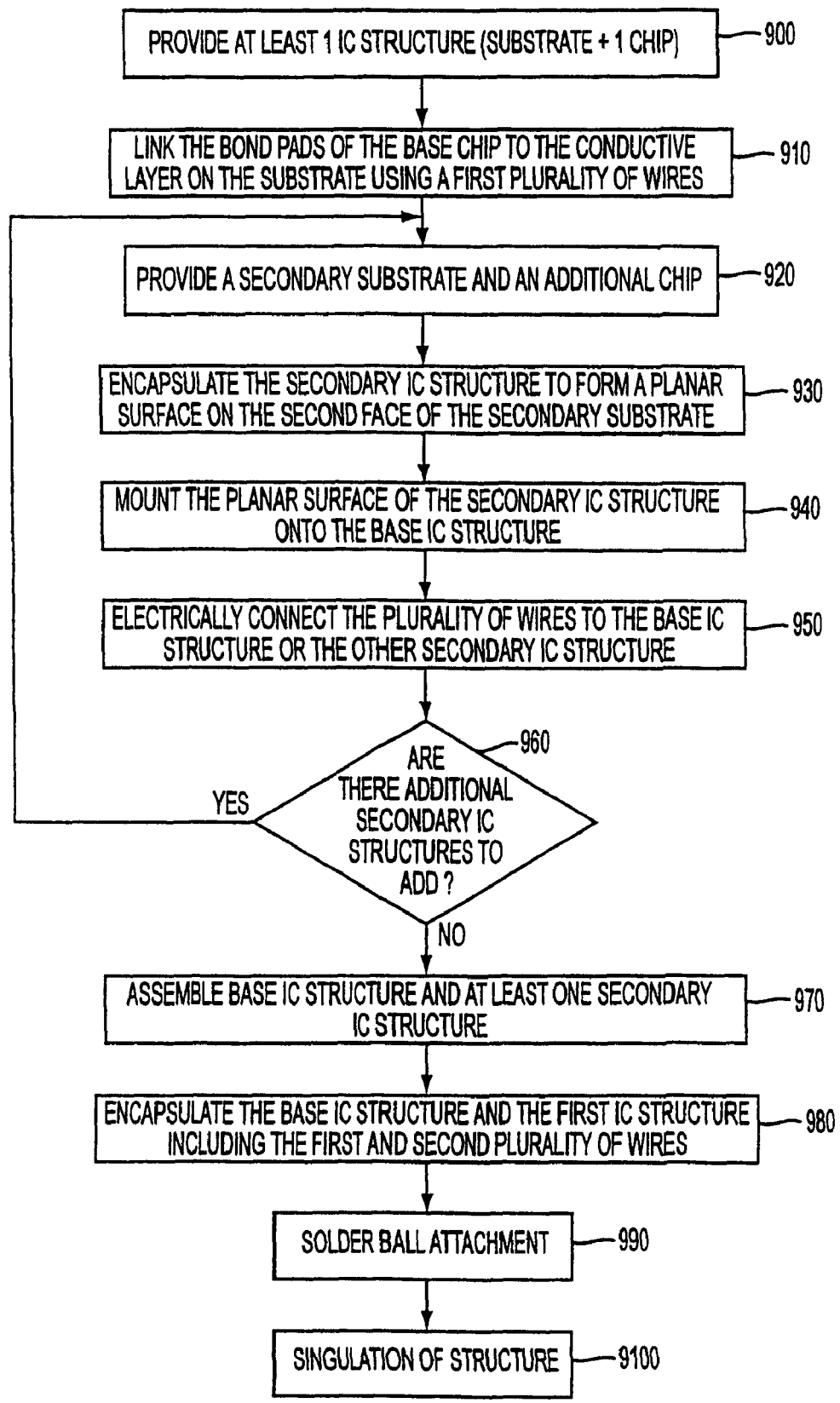
FIG. 9 illustrates an exemplary method of assembling an IC package.

According to a second exemplary embodiment of the present invention, and with reference to the structures illustrated in and previously described with respect to FIGS. 3A-3C, 4A-4C, and 5-8, a method of assembling an IC package in general (shown in FIG. 9), which is particularly applicable to the assembly of a BGA package, comprises providing a base IC structure 300, comprising a base substrate 301 and a first semiconductor chip 315 mounted on the base substrate in a die-down configuration (see step 900). The method also comprises electrically conductively linking the bond pads 317 of the base chip 315 to the conductive layer 306 on the second face of the base substrate 301b using the first plurality of wires 321 the wires (see step 910). The method also comprises providing a secondary IC structure 400, comprising a secondary substrate 401 and an additional semiconductor chip 415 (see step 920). Next, the method comprises encapsulating the secondary IC structure to form a planar surface on the second face of the secondary substrate (see step 930). The method also comprises mounting the substantially planar surface 425a of the secondary IC structure 400 to the base IC structure 300 (see step 940). An adhesive layer 504 is disposed on the first face 315a of the first semiconductor chip 315. The substantially planar surface 425a is then mounted on the adhesive layer 504. The method also comprises electrically connecting the plurality of wires to the base IC structure 300 or the other secondary IC structure 400 (see step 950). A plurality of wires 521 links a conductive trace 403 of the secondary IC structure to a conductive portion 303 of the base IC structure 300 (see step 950). The method also comprises determining whether there are additional secondary IC structures to add to the package (see step 960), and if so, repeating the preparation (or procurement) of an additional secondary IC structure. Once it is determined that no further secondary IC structures are needed, the method comprises assembling the base IC structure and at least one secondary IC structure (see step 970). The method further comprises encapsulating the base IC structure and the first IC structure including the first and second plurality of wires with an encapsulant 525 (see step 980). The method comprises attaching solder balls to the structure (see step 990). Finally, the method comprises singulation of the entire structure (see step 9100).

Although the above exemplary embodiments of the present invention have been described, it will be understood by those skilled in the art that the present invention should not be limited to the described exemplary embodiments, but that various changes and modifications can be made within the spirit and scope of the present invention. Accordingly, the scope of the present invention is not limited to the described range of the following claims.

What is claimed is:

1. A ball grid array package comprising:
   a base IC structure, the base IC structure comprising:
      a base substrate having a first base substrate face, a second base substrate face opposite to said first base substrate face, a base substrate opening extending between said first base substrate face and said second base substrate face, and a base conductor;
      a first semiconductor chip, comprising a first chip face, a second chip face opposite to said first chip face, and first bond pads disposed over said base substrate opening; and
      a first plurality of wires disposed to pass through said base substrate opening and electrically connecting said first bond pads to said base conductor; and
   a secondary IC structure, comprising:
      a second substrate having a first secondary substrate face, a second secondary substrate face opposite to said first secondary substrate face, a secondary opening extending between said first secondary substrate face and said second secondary substrate face, and a secondary conductor;
      a second semiconductor chip, comprising a first secondary chip face, and a second bond pad disposed over said secondary opening; and
      a second plurality of wires electrically connecting said second bond pads to said secondary conductor through said secondary opening;
      a first encapsulant filling said secondary opening around said second plurality of wires and covering said second secondary substrate face, wherein said first encapsulant provides a structure that enables mounting of said secondary IC structure on said base IC structure; and
      a third plurality of wires connecting said secondary IC structure to said base IC structure;
   wherein said secondary IC structure is adhesively mounted directly on said first chip face of said base IC structure.

2. A ball grid array package comprising:
   a base IC structure, the base IC structure comprising:
      a base substrate having a first base substrate face, a second base substrate face opposite to said first base substrate face, a base substrate opening extending between said first base substrate face and said second base substrate face, and a base conductor;
      a first semiconductor chip, comprising a first chip face, a second chip face opposite to said first chip face, and first bond pads disposed over said base substrate opening; and
      a first plurality of wires disposed to pass through said base substrate opening and electrically connecting said first bond pads to said base conductor; and
   a secondary IC structure, comprising:
      a second substrate having a first secondary substrate face, a second secondary substrate face opposite to said first secondary substrate face, a secondary opening extending between said first secondary substrate face and said second secondary substrate face, and a secondary conductor;
      a second semiconductor chip, comprising a first secondary chip face, and a second bond pad disposed over said secondary opening; and
      a second plurality of wires electrically connecting said second bond pads to said secondary conductor through said secondary opening;
      a first encapsulant filling said secondary opening around said second plurality of wires and covering said second secondary substrate face; and
      a third plurality of wires connecting said secondary IC structure to said base IC structure;
   wherein said secondary IC structure is adhesively mounted directly on said first chip face of said base IC structure
   said base substrate further comprises a plurality of vias extending between said first base substrate face and said second base substrate face;
   said base conductor extends through said vias; and
   said base substrate further comprises a layer of solder mask disposed on portions of said first and second chip faces.

3. The ball grid array package according to claim 1, further comprising molding compound encapsulating at least portions of said base IC structure and said secondary IC structure.

4. The ball grid array package according to claim 3, wherein said molding compound encapsulates said third plurality of wires.

5. The ball grid array package according to claim 3, wherein said first secondary chip face is free of said molding compound.

6. A ball grid array package comprising:
   a base IC structure, the base IC structure comprising:
      a base substrate having a first base substrate face, a second base substrate face opposite to said first base substrate face, a base substrate opening extending between said first base substrate face and said second base substrate face, and a base conductor;
      a first semiconductor chip, comprising a first chip face, a second chip face opposite to said first chip face, and first bond pads disposed over said base substrate opening; and a first plurality of wires disposed to pass through said base substrate opening and electrically connecting said first bond pads to said base conductor; and a secondary IC structure, comprising:
- a second substrate having a first secondary substrate face, a second secondary substrate face opposite to said first secondary substrate face, a secondary opening extending between said first secondary substrate face and said second secondary substrate face, and a secondary conductor;
- a second semiconductor chip, comprising a first secondary chip face, and a second bond pad disposed over said secondary opening; and
- a second plurality of wires electrically connecting said second bond pads to said secondary conductor through said secondary opening;

a first encapsulant filling said secondary opening around said second plurality of wires and covering said second secondary substrate face, wherein said first encapsulant provides a structure that enables mounting of said secondary IC structure on said base IC structure;

a third plurality of wires connecting said secondary IC structure to said base IC structure;

molding compound encapsulating at least portions of said base IC structure and said secondary IC structure;

at least one additional of said secondary IC structure mounted over said first secondary chip face; and respective wires connecting a conductive portion of said at least one additional secondary IC structure to said base IC structures wherein said secondary IC structure is mounted on said base IC structure.

7. A ball grid array package comprising:

a base IC structure, the base IC structure comprising:
- a base substrate having a first base substrate face, a second base substrate face opposite to said first base substrate face, a base substrate opening extending between said first base substrate face and said second base substrate face, and a base conductor;
- a first semiconductor chip, comprising a first chip face, a second chip face opposite to said first chip face, and first bond pads disposed over said base substrate opening; and
- a first plurality of wires disposed to pass through said base substrate opening and electrically connecting said first bond pads to said base conductor; and a secondary IC structure, comprising:
- a second substrate having a first secondary substrate face, a second secondary substrate face opposite to said first secondary substrate face, a secondary opening extending between said first secondary substrate face and said second secondary substrate face, and a secondary conductor;
- a second semiconductor chip, comprising a first secondary chip face, and a second bond pad disposed over said secondary opening; and
- a second plurality of wires electrically connecting said second bond pads to said secondary conductor through said secondary opening;

a first encapsulant filling said secondary opening around said second plurality of wires and covering said second secondary substrate face, wherein said first encapsulant provides a structure that enables mounting of said secondary IC structure on said base IC structure;

a third plurality of wires connecting said secondary IC structure to said base IC structure;

molding compound encapsulating at least portions of said base IC structure and said secondary IC structure; and a thermal dissipation element disposed over said first secondary chip face;

wherein said secondary IC structure is adhesively mounted directly on said first chip face of said base IC structure.

8. A method of assembling a ball grid array package, comprising:

providing a base IC structure, comprising
- a base substrate having a first base substrate face, a second base substrate face opposite to said first base substrate face, a base substrate opening extending between said first base substrate face and said second base substrate face, and a base conductor;
- a first semiconductor chip, comprising a first chip face, a second chip face opposite to said first chip face, and first bond pads disposed over said base substrate opening; and
- a first plurality of wires disposed to pass through said base substrate opening and electrically connected said first bond pads to said base conductor;

providing a first secondary IC structure, comprising
- a second substrate having a first secondary substrate face, a second secondary substrate face opposite to said first secondary substrate face, a secondary opening extending between said first secondary substrate face and said second substrate face, and a secondary conductor;
- a second semiconductor chip, comprising a first secondary chip face, and a second bond pad disposed over said secondary opening; and
- a second plurality of wires electrically connecting said second bond pads to said secondary conductor through said secondary opening;

adhesively mounting the first IC structure directly on said first chip face of said base IC structure electrically connecting said secondary IC structure to said base IC structure using at least a third plurality of wires, encapsulating said base IC structure and said first secondary IC structure, including said first plurality of wires in said base substrate opening, and encapsulating said first secondary IC structure, including said second plurality of wires in said secondary opening, and said second secondary substrate face, wherein said encapsulant provides a structure that enables mounting of said first secondary IC structure on said base IC structure.

9. The method of claim 8, wherein said encapsulating step comprises first encapsulating said first secondary IC structure and subsequently encapsulating said base IC structure and said first secondary IC structure, together with said first and second plurality of wires.

10. A method of assembling a ball grid array package, comprising:

providing a base IC structure, comprising a base substrate having a first base substrate face, a second base substrate face opposite to said first base substrate face, a base substrate opening extending between said first base substrate face and said second base substrate face, and a base conductor;

a first semiconductor chip, comprising a first chip face, a second chip face opposite to said first chip face, and first bond pads disposed over said base substrate opening; and a first plurality of wires disposed to pass through said base substrate opening and electrically connected said first bond pads to said base conductor;

providing a first secondary IC structure, comprising
- a second substrate having a first secondary substrate face, a second secondary substrate face opposite to said first secondary substrate face, a secondary opening extending between said first secondary substrate face and said second substrate face, and a secondary conductor;
- a second semiconductor chip, comprising a first secondary chip face, and a second bond pad disposed over said secondary opening; and
- a second plurality of wires electrically connecting said second bond pads to said secondary conductor through said secondary opening;

mounting the first secondary IC structure to said base IC structure;

electrically connecting said first secondary IC structure to said base IC structure using at least a third plurality of wires, and encapsulating said base IC structure and said first secondary IC structure, including said first plurality of wires in said base substrate opening, said second plurality of wires in said secondary opening, and said second secondary substrate face;

providing a second secondary IC structure, comprising a third substrate and a third semiconductor chip mounted on said secondary substrate in a die-down configuration;

encapsulating said second secondary IC structure, such that encapsulant forms a substantially planar surface on the underside of said secondary IC structure;

mounting the substantially planar surface of said encapsulant to said first secondary IC structure;

electrically connecting a conductive portion of said second secondary IC structure to a conductive portion of at least one of said base IC structure and said first secondary IC structure; and connecting the second secondary IC structure to at least one of the base IC structure and the first secondary IC structure using a plurality of wires.

11. The method of claim 8, further comprising encapsulating at least part of the base IC structure and the first secondary IC structure.

12. The method of claim 10, further comprising encapsulating at least part of the base IC structure, the first secondary IC structure and the second secondary IC structure.

13. The method of claim 12, further comprising attaching solder balls to the base IC structure.

14. The method of claim 13, further comprising singulation of the entire BGA structure.

* * * * *